(12) United States Patent
Beyne et al.

(10) Patent No.: US 8,907,471 B2
(45) Date of Patent: Dec. 9, 2014

(54) WINDOW INTERPOSED DIE PACKAGING

(75) Inventors: Eric Beyne, Kapeldreef (BE); Paresh Limaye, Kapeldreef (BE)

(73) Assignee: IMEC, Leuven (BE)

( * ) Notice: Subject to any disclaimer, the term of this patent is extended or adjusted under 35 U.S.C. 154(b) by 0 days.

(21) Appl. No.: 13/517,934

(22) PCT Filed: Dec. 23, 2010

(86) PCT No.: PCT/EP2010/070684
§ 371 (c)(1),
(2), (4) Date: Jul. 24, 2012

(87) PCT Pub. No.: WO2011/076934
PCT Pub. Date: Jun. 30, 2011

(65) Prior Publication Data
US 2012/0280381 A1 Nov. 8, 2012

Related U.S. Application Data

(60) Provisional application No. 61/290,097, filed on Dec. 24, 2009.

(30) Foreign Application Priority Data

Dec. 24, 2009 (EP) .................... 09180763

(51) Int. Cl.
*H01L 23/053* (2006.01)
*H01L 21/00* (2006.01)
(Continued)

(52) U.S. Cl.
CPC ... *H01L 23/5389* (2013.01); *H01L 2224/16225* (2013.01); *H01L 2224/73204* (2013.01);
(Continued)

(58) Field of Classification Search
USPC ......... 257/675, 706, 707, 708, 723, 684, 693, 257/698, 700, 680, 687, 782, 783, 778, 257/E23.04, E23.128, E23.169, E23.182; 438/106, 108, 110, 118, 125
See application file for complete search history.

(56) References Cited

U.S. PATENT DOCUMENTS 5,786,628 A 7/1998 Beilstein, Jr. et al.
6,365,963 B1 * 4/2002 Shimada ................. 257/686
(Continued)

FOREIGN PATENT DOCUMENTS

EP 0644547 A2 3/1995
WO WO9505676 A1 2/1995

OTHER PUBLICATIONS

PCT International Search Report and Written Opinion, PCT International Application No. PCT/EP2010/070684 dated Mar. 21, 2011.

*Primary Examiner* — Jasmine Clark
(74) *Attorney, Agent, or Firm* — McDonnell Boehnen Hulbert & Berghoff LLP (57) ABSTRACT

A semiconductor device is described advantageously making use of the interposer principle. The semiconductor device comprises at least one semiconductor die, a window substrate being an inorganic substrate comprising at least one window-shaped cavity for mounting the at least one semiconductor die, the window substrate having interconnect structures. Furthermore, the at least one semiconductor die is positioned inside the at least one cavity and is connected to the interconnect structures, providing connections to another level of assembly or packaging of the semiconductor device. The invention also relates to a method of manufacturing such a semiconductor device.

20 Claims, 9 Drawing Sheets

(51) Int. Cl.
*H01L 23/538* (2006.01)
*H01L 23/36* (2006.01)
*H01L 23/31* (2006.01)
*H01L 23/00* (2006.01)
*H01L 25/065* (2006.01)

(52) U.S. Cl.
CPC ... *H01L 25/0657* (2013.01); *H01L 2924/01075* (2013.01); *H01L 2224/97* (2013.01); *H01L 2924/09701* (2013.01); *H01L 2924/01006* (2013.01); *H01L 2924/14* (2013.01); *H01L 2924/18161* (2013.01); *H01L 2924/01016* (2013.01); *H01L 2924/15311* (2013.01); *H01L 2924/07811* (2013.01); *H01L 2924/01029* (2013.01); *H01L 2924/014* (2013.01); *H01L 2924/01032* (2013.01); *H01L 2924/01013* (2013.01); *H01L 23/36* (2013.01); *H01L 2924/01005* (2013.01); H01L 23/3128 (2013.01); *H01L 2924/01023* (2013.01); *H01L 2924/01033* (2013.01); H01L 23/562 (2013.01); H01L 24/97 (2013.01)
USPC ........ 257/700; 257/687; 257/693; 257/782; 257/783; 257/E23.04; 257/E23.169; 438/106; 438/110

(56) References Cited

U.S. PATENT DOCUMENTS

| | | | |
|---|---|---|---|
| 7,164,210 B2* | 1/2007 | Tsai et al. | 257/796 |
| 7,445,957 B2* | 11/2008 | Huang et al. | 438/106 |
| 7,605,477 B2* | 10/2009 | Wong et al. | 257/777 |
| 2001/0003049 A1 | 6/2001 | Fukasawa et al. | |
| 2005/0136634 A1 | 6/2005 | Savastiouk et al. | |
| 2006/0267213 A1 | 11/2006 | Ozguz et al. | |
| 2009/0065920 A1 | 3/2009 | Ahn et al. | |
| 2009/0071705 A1 | 3/2009 | Kim et al. | |

* cited by examiner

WINDOW INTERPOSED DIE PACKAGING

CROSS-REFERENCE TO RELATED APPLICATIONS

This application claims priority to International Application Serial No. PCT/EP2010/070684 filed Dec. 23, 2010, the contents of which are hereby incorporated by reference, which in turn claims priority to U.S. Provisional Patent Application Ser. No. 61/290,097 filed Dec. 24, 2009, the contents of which are hereby incorporated by reference.

FIELD

The invention relates to the field of integrated circuit technology. More particularly, the present invention relates to methods of assembling and/or packaging of integrated circuits using interconnect structures as well as to devices thus obtained.

BACKGROUND

With the continued scaling of IC technology, due to the large amount of electronic circuits on a small area, the density of chip input/output connection pads (I/O's) continues to increase. It becomes increasingly difficult for traditional IC packaging technologies to deal with this high density and to enable fan-out routing to a large I/O pitch. This is becomes even more stringent when dealing with 3D-IC stacks.

Figure 1:
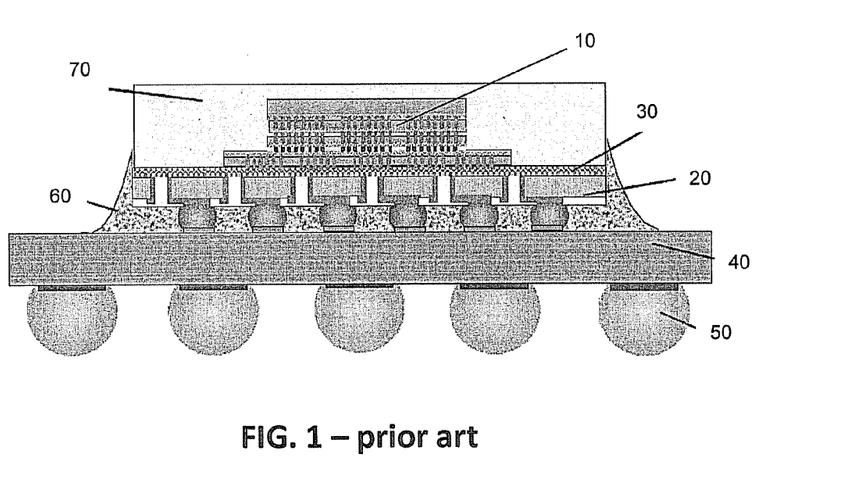
FIG. 1 illustrates a semiconductor device using an interposer as known from prior art.

A solution is to use a package that re-arranges or converts the input/output pitch of the die to a larger pitch area array that can be handled by the system level printed circuit board. This typically results in a package size that is several times larger than the stack itself. In order to obtain such a re-arrangement, one solution is the use of a silicon-based interconnect substrate. The die or stack of dies is assembled to this substrate which provides adequate interconnect and wiring density. If this Si-interposer also has through-Si via connections, a device with a high density of area-array connections may result. To protect the die, this interposer substrate may be encapsulated by a wafer-level transfer moulding encapsulation process. After dicing, the final Si-interposer package may then be assembled in a more traditional package, e.g. a ball-grid array (BGA), or assembled directly on a printed circuit board (PCB), similar to wafer-level chip-scale packages (WL-CSP). By way of illustration, an example thereof is shown in FIG. 1, indicating a packaged chip making use of an interconnect substrate. A chip 10 is shown being assembled to a through silicon via interposer substrate 20 which is 3D wafer level packaged. Between the interposer substrate 20 and the chip 10 multilayer thin film layers 30 or CMOS back end of line (BEOL) layers typically are present. Connection with the next level of assembly is obtained via through-silicon-vias. In the present example, the next level of assembly is a laminate interposer board 40, which itself can be contacted via a ball grid array or chip-scale packaging solder balls 50. To obtain reliable packaging underfill 60 and transfer moulding compound encapsulation 70 may be used.

In this approach the moulding compound on the interposer wafer with mounted die causes wafer-bow as the assembly is strongly asymmetric. One known solution for preventing wafer-bow is selecting a transfer moulding compound encapsulation with a thermal expansion coefficient similar to that of the wafer used, however a perfect match across the temperature ranges of interest (typically: −55° C. to +300° C.) is not achievable as these compounds consist of a mixture of organic (high CTE, Coefficient of Thermal Expansion) and inorganic compounds (low CTE), where both the Young modulus, E, and Coefficient of Thermal Expansion, CTE, vary significantly as a function of temperature and differ from the temperature variations of E and CTE of the semiconductor devices used. Furthermore the encapsulation with moulding compound causes an increase in thermal resistance of the devices.

US2006/267213 by Ozguz et al., describes a stackable tier structure with one or more integrated circuit dies and one or more feedthrough structures. The dies thereby are positioned into the window of a window substrate. The input/output pads of the integrated circuit die are electrically rerouted using conductive traces from the first side of the tier structure to a feedthrough in the window substrates, to a second side of the tier structure. Stacked tiers can also obtained by stacking different window substrates, each having its die and by electrically connecting these using the feedthroughs in the window substrates.

SUMMARY

It is an object of embodiments of the present invention to provide good methods for manufacturing semiconductor devices making use of an interposer strategy as well as good devices thus obtained. It is an advantage of embodiments according to the present invention that good methods for manufacturing semiconductor devices are obtained, the semiconductor devices providing the advantage of fanning out to large pitch area-array connections, compatible with package level input/output pitches.

It is an advantage of embodiments according to the present invention to provide semiconductor devices having a good heat conductivity.

It is an advantage of embodiments according to the present invention that semiconductor devices are provided wherein the mechanical stress is decoupled, i.e. the mechanical strain of the package is not imposed or to a lesser degree imposed on the substrates used in the package.

The presented embodiments of the invention allow for testing the interconnect layer before the assembly of the die, therefore reducing the risk of compound yield loss. Assembling the die towards the end of the fabrication process reduces the risks for generating defects in the embedded die, hence a higher final process yield can be achieved.

The above objective is accomplished by a method and device according to the present invention.

The present invention relates to a semiconductor device, the semiconductor device comprising at least one semiconductor die, a window substrate being an inorganic substrate comprising at least one cavity for mounting the at least one semiconductor die and a substantially planar interconnect structure to at least one side of the window substrate, and the at least one die being positioned inside the at least one cavity, and being connected to the interconnect structure adjacent the at least one die, the interconnect structure forming the electrical connection between the at least one die and another level of assembly or packaging of the semiconductor device. It is an advantage of embodiments according to the present invention that a semiconductor device is obtained being little or not subject to curving due to thermal loads on materials surrounding the at least one die. It is an advantage of embodiments according to the present invention that good semiconductor devices are obtained using an interposer substrate for increasing the contact surface for contacting the die.

The interconnect structure may be substantially flat and it may be in physical contact with the window substrate. The device may be such that the electrical connection between the at least one die and the another level of assembly or packaging of the semiconductor device lies fully outside the window substrate.

The material of the window substrate may have a coefficient of thermal expansion being the same or being closely matched to the coefficient of thermal expansion of the semiconductor die. It is an advantage of embodiments according to the present invention that semiconductor devices are obtained being little or not subject to bowing after assembling the die in the window substrate.

The cavity may extend throughout the first window substrate. It is an advantage of embodiments according to the present invention that semiconductor devices are obtained that allow connecting the die to interconnect structures of an interposer, while surrounding the die substantially with material having the same thermal behavior.

The semiconductor device may comprise filling materials at positions between the at least one die and the edges of the at least one cavity in the window substrate material. The filling material may be epoxy material.

The interconnect structure may be adapted for providing connectivity between the at least one die using a first input/output pitch typical for the at least one die and a further element using a larger input/output pitch. It is an advantage of embodiments according to the present invention that these make use of the interposer principle allowing a high density of electronic circuits in the die while allowing an efficient and easy connection of the semiconductor device with external components.

The interconnect structure may be physically positioned or located between the at least one die and the electrical contacts of the further level of assembly or packaging of the semiconductor device.

The at least one die may be mounted on the interconnect structure.

The semiconductor device may comprise a further substrate being a through-silicon-via substrate forming an interposer with the interconnect structures or a thin flexible substrate forming an interposer with the interconnect structures. It is an advantage of some embodiments according to the present invention that connectivity with a through-silicon-via substrate can also be used.

The interposer substrate with through-silicon-via connections may be an active device wafer.

The at least one semiconductor die may be a stack of dies positioned in the cavity of the window substrate. The stack of dies may have at least one die comprising through silicon vias for electrically connecting further dies with the another level of assembly or packaging of the semiconductor device.

The interconnect structures and the window substrate may form an interposer. It is an advantage of embodiments according to the present invention that the window substrate can be used as part of the interposer, thus allowing a thinner semiconductor device.

The semiconductor device furthermore may comprise a heat sink in direct contact with the at least one die and the window substrate. It is an advantage of embodiments according to the present invention that accurate cooling of the die can be obtained by the possibility of direct contact between the die and the heat sink. In direct contact may mean that there is no moulding material between the die and the heat sink. The heat sink may comprise a flat surface, whereby the flat surface is in direct contact with the at least one die and the window substrate.

The present invention also relates to an interposer device comprising a window substrate being an inorganic substrate comprising at least one cavity for mounting at least one semiconductor die and a substantially planar interconnect structure fixed to one side of the window substrate so as to be adjacent the cavity and so as to be arranged for receiving the at least one semiconductor die for forming an electrical connection between the die and another level of assembly or packaging of the semiconductor device.

The interposer may have an interconnect structure comprising any or a combination of a passivation layer for passivating the interconnect structure or ball grid or solder bump contacts for connecting with the at least one die. Electrical contacts alternatively also may be provided by electroless plated solder (Sn) contacts.

The interposer may in some embodiments be between 25 and 300 μm thick, e.g. between 25 μm and 200 μm, more particularly between 25 μm and 100 μm. The interconnect structure may be a flexible interconnect structure.

The present invention also relates to a method for manufacturing a semiconductor device, the method comprising obtaining a window substrate comprising at least one cavity, providing a substantially planar interconnect structures to at least one side of the window substrate, and embedding at least one die in the cavity, the at least one die being connected to the interconnect structures. The interconnect structure thereby is positioned such that it is adjacent the at least one die such that it can form the electrical connection between the at least one die and another level of assembly or packaging of the semiconductor device. The method may comprise the step of mounting the die on the interconnect structure and/or of electrically connecting the semiconductor die with the interconnect structure.

Obtaining a window substrate may comprise obtaining an inorganic substrate, and providing a cavity in the inorganic substrate suitable for embedding the at least one die.

The method furthermore may comprise interposing the die connected at a first input/output connection pitch with a further element connectable at a larger input/output connection pitch.

Providing interconnect structures may comprise bonding the window substrate with a through-silicon-via substrate comprising the interconnect structures, e.g. using the interconnect structure.

The method furthermore may comprise back grinding the at least one die and the window substrate.

The method furthermore may comprise providing a heat sink in direct contact with at least the die.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

BRIEF DESCRIPTION OF THE DRAWINGS

FIG. 5 to FIG. 8 illustrate for exemplary methods for manufacturing a semiconductor device according to embodiments of the present invention.

The drawings are only schematic and are non-limiting. In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

DEFINITIONS

Where reference is made in embodiments of the present invention to "window substrate" this refers to an inorganic substrate with window-shaped holes for mounting a semiconductor die. The "window substrate" advantageously has a coefficient of thermal expansion matched or closely matched to that of the semiconductor die.

Where in embodiments according to the present invention reference is made to "substrate", reference is made to an inorganic substrate, such as for example a glass or glass-like substrate, a dielectric substrate, a ceramic substrate or a semiconductor substrate, such as for example a silicon substrate, a germanium substrate, a III-V semiconductor substrate or a sapphire substrate.

Where in embodiments according to the present invention reference is made to "closely matched CTE", reference may be made to materials having coefficients of thermal expansion differing not more than 25%, advantageously not more than 20%, more advantageously not more than 15%, still more advantageously not more than 10%, even more advantageously not more than 5%, still more advantageously not more than 1% over a predetermined temperature range. The predetermined temperature range may be for example in the range 0° C. to 200° C., advantageously in the range −55° C. to 300° C. Where reference is made to the coefficient of thermal expansion of an object comprising different materials, reference may be made to the average coefficient of thermal expansion or a measured coefficient of thermal expansion. Embodiments of the present invention also includes that reference is made to the thermal expansion coefficient of the major part of the material the semiconductor die is fabricated in.

Where in embodiments according to the present invention, reference is made to "another level of assembly or packaging", reference may be made to the portion of the semiconductor device that can be connected to the interconnect structures, whereby the semiconductor device may be considered as having different levels of assembly or packaging. The "another level of assembly or packaging" may be a "next level of assembly or packaging". It may include a portion of the semiconductor device such as for example another chip or die, another chip or die having a different size than the die embedded in the window substrate, a part of the package. The another level of assembly or packaging also may be a vertical (3D) stacking.

Where in embodiments according to the present invention reference is made to a "cavity", reference is made to a region in the semiconductor device formed by a window-shaped hole in the window substrate, that may be filled with a semiconductor die and with filling material. The edges or walls of the cavity can be defined as the edges or walls surrounding the original window-shaped hole.

Where in embodiments of the present invention reference is made to a substantially planar interconnect structure, reference is made to an interconnect structure extending mainly in two dimensions and having a limited thickness in a third direction forming the thickness of the interconnect structure.

DETAILED DESCRIPTION OF ILLUSTRATIVE EMBODIMENTS

Where in embodiments according to the present invention reference is made to at least one die, the latter also envisages a stack of dies.

In a first aspect, the present invention relates to a semiconductor device. The semiconductor device comprises at least one semiconductor die. The semiconductor device may be an integrated circuit or be a part thereof. The semiconductor device according to embodiments of the present invention is especially suitable for using an interposer principle, e.g. for providing a re-arrangement or conversion of the input/output pitch at the level of the die to a larger pitch area array that e.g. can be handled by the system level printed circuit board. The semiconductor device according to embodiments of the present invention also is well suited for the realization of 3D chip stacks which consist of chips of unequal size. The semiconductor device according to embodiments of the present invention comprises a window substrate provided with interconnect structures at at least one side. The window substrate furthermore comprises at least one cavity, whereby the at least one die is positioned inside the at least one cavity and the at least one die is connected to the interconnect structures. The at least one cavity thus may initially be a hole in the window substrate that is filled with the at least one die. By way of illustration, embodiments of the present invention not being limited thereby, a detailed description of a semiconductor device according to one embodiment of the present invention is discussed with reference to FIG. 2, indicating standard and optional components.

Figure 2:
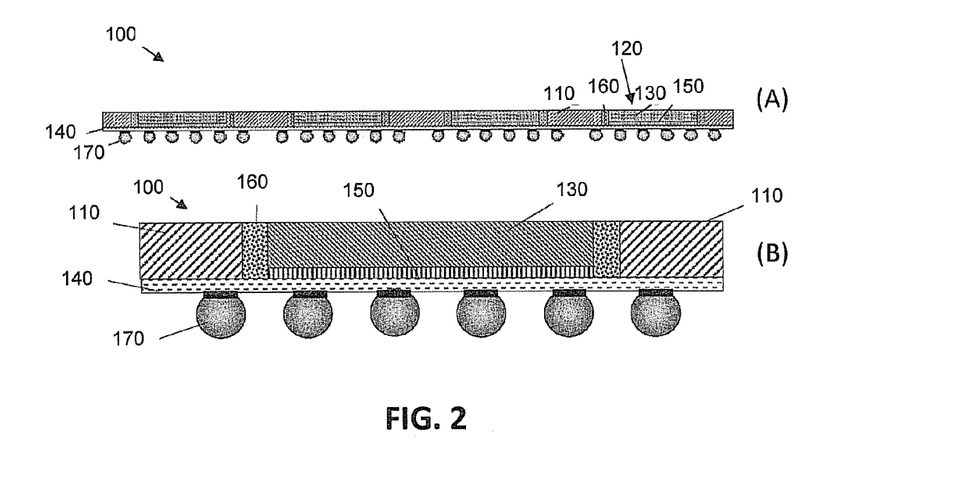
FIG. 2 illustrates a side view (A) and an enlarged view (B) of a semiconductor device using an interposer whereby the die is mounted in window-shaped holes in a CTE-matched inorganic substrate, according to an embodiment of the present invention. This CTE-matched inorganic substrate with window-shaped holes is referred to as the "window substrate".

In FIG. 2 a semiconductor device 100 is shown making use of an interposer principle for providing connectivity to at least one die. FIG. 2 illustrates a wafer cross-section at the top (A) and a package after wafer dicing at the bottom (B). The semiconductor device 100 comprises an inorganic substrate 110, referred to as the "window substrate". The window substrate 110 may be made from any suitable material with a coefficient of thermal expansion, CTE, closely matched or matching, over the relevant temperature range, e.g. in a temperature range 0° C. to 200° C., advantageously in a temperature range −55° C. to +300° C., to the CTE of the semiconductor die, 130, that is embedded in its windows. The best matching is obtained by using the material as used for the substrate material of the semiconductor die 130, (Typically silicon, germanium, III-V semiconductors, sapphire), as those materials will also match the other mechanical properties of the devices, such as the Young modulus. Also possible for example is the use of ceramic or glass substrates that are engineered to track the CTE as a function of temperature of the semiconductor devices. These will however not track the other mechanical properties as closely.

The window substrate 110 comprises at least one cavity 120, also referred to as window, adapted for comprising the at least one die 130. The at least one cavity 120 may be window-shaped. The size of the at least one cavity 120 is adapted for accommodating the at least one die. In such a cavity a single die as well as a stack of dies may be provided. Typical examples of such cavity 120 may have an average dimension between 2 mm and 50 mm, advantageously between 2 mm and 20 mm, although embodiments of the present invention are not limited thereto. The at least one cavity 120 may advantageously be sized such that the free spacing between edges of the cavity 120 and the die 130 positioned therein. The relative area of the window substrate that is taken by the at least one cavity in one example may be in the range 10% to 25%. The cavity 120 typically may be made through etching or by laser processing such as for example laser cutting, although the invention is not limited thereby.

The semiconductor device 100 furthermore comprises interconnect structures 140 positioned at at least one side of the window substrate 110. Such interconnect structures 140 may be back-end-of-line structures although embodiments according to the present invention are not limited thereto. The interconnect structures 140 advantageously are suitable for providing input/output connections to the die 130. The interconnect structures 140 advantageously form an interposer, allowing to re-arrange the input/output pitch as required at the die to an input/output pitch suitable for use at a further system level, i.e. such as at the level of a printed circuit board, covering an area large than the size of the die 130 (Fan-out). The interconnect structures 140 may for example comprise:

A separate inorganic substrate with a CTE matched or CTE closely matched to the window wafer and with interconnect layers and through-substrate vertical connections. (e.g. as in FIG. 5), or A separate active substrate with a CTE matched or CTE closely matched to the window wafer and with interconnect layers and through-substrate vertical connections. (e.g. as in FIG. 5) (this case is effectively a 3D IC stacking solution), or A separate thin, flexible organic substrate with interconnect layers and through-substrate vertical connections. (e.g. as in FIGS. 6, 7), or Thin semiconductor back-end-of-line interconnect layers (e.g. as in FIGS. 7 and 8)

The interconnect structure may be positioned such that it is adjacent the cavity. The at least one die may be physically and electrically connected to the interconnect structure. The interconnect structure typically may be located as a planar structure adjacent the window substrate, e.g. fixed thereto.

It is an advantage of embodiments of the present invention that no electrical feedthroughs in the window substrate.

The at least one die 130 may for example be a single die, multiple dies or 3D die stacks. In embodiments of the present invention a stack of dies may be introduced in the cavity of the window substrate. In case a stack of dies is used, at least one of the dies may be provided with feedthroughs, e.g. silicon through vias, for connecting other dies in the stack, e.g. for providing connection between the other dies and the interconnect structure. The die may comprise an electronic circuit or electronic circuits providing one or more functionalities. In one example, the die may be a logic die optionally bound to another die or other die stack. The die 130 typically may be made using known die-processing techniques. It may be a packaged die or a packaged die stack. The at least one die 130 may be provided with a die-to-interposer connection 150 for connecting the at least one die 130 with the interconnect structures 140. Such a die-to-interposer connection 150 may be a micro-flip chip connection, a metal/metal thermocompression, a conductive adhesive joining, etc.

The semiconductor device 100 furthermore may comprise a filling material 160 for embedding the at least one die 130 in the cavity. The filling material 160 thereby is an encapsulation material for filling the space between the edge of the cavity 120 and the at least one die 130. The filling material 160 may be a polymer or particle-filled polymer, epoxy based material, silica based material, materials similar as those used in under fill, glob-top or overmould compounds, etc that fills all gaps between the window substrate 110, the interconnect structures 140 and the at least one die 130.

The semiconductor device 100 furthermore may comprise pads 170, such as for example solder balls for connecting the interposer to the next level assembly. Standard bumping techniques can be used. Alternatively or in addition thereto under bump metallurgy pads could already be available, e.g. in an ultra thin chip flexible interposer. The next level assembly may be a printed circuit board PCB, although the invention is not limited thereto. For example, the next level assembly may for example be a laminate ball grid array interposer. The semiconductor device 100 also may for example also be connected by providing wire connections to the interconnect structures.

Figure 3:
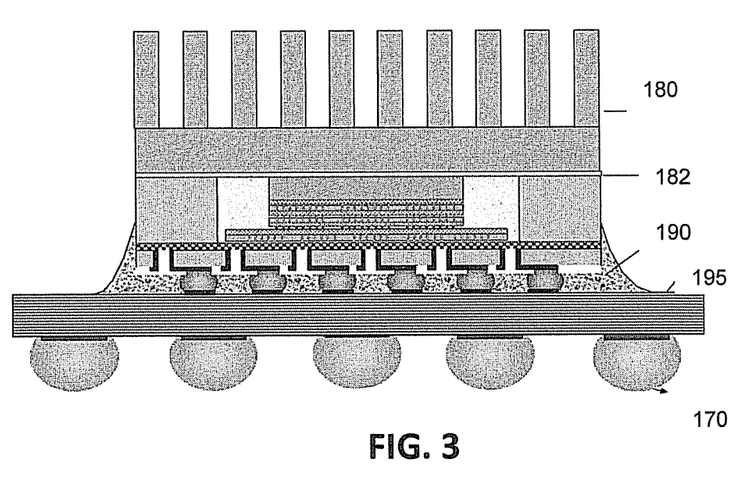
FIG. 3 illustrates a semiconductor device according to an embodiment of the present invention wherein a heat sink is provided in direct contact with the die.

In one embodiment according to the present invention the semiconductor device 100 furthermore may be equipped with a heat sink 180. The heat sink 180 may be contacted with the at least one die and optionally also with the window substrate. The heat sink 180 may be brought into direct contact with the die 130 and/or the window substrate 110 by applying a layer of thermal grease 182 allowing good thermal contact. The heat sink 180 may comprise a flat surface for contacting the die and the window substrate. The heat sink 180 also may comprise a set of cooling fins. The latter is illustrated by way of example in FIG. 3, illustrating the heat sink 180 in direct contact with the die 130 via a layer of thermal grease. Where in embodiments of the present invention direct contact between a heat sink and a die is described, this includes contacting the die via a thermal conductive layer, such as for example a layer of thermal grease.

Figure 4:
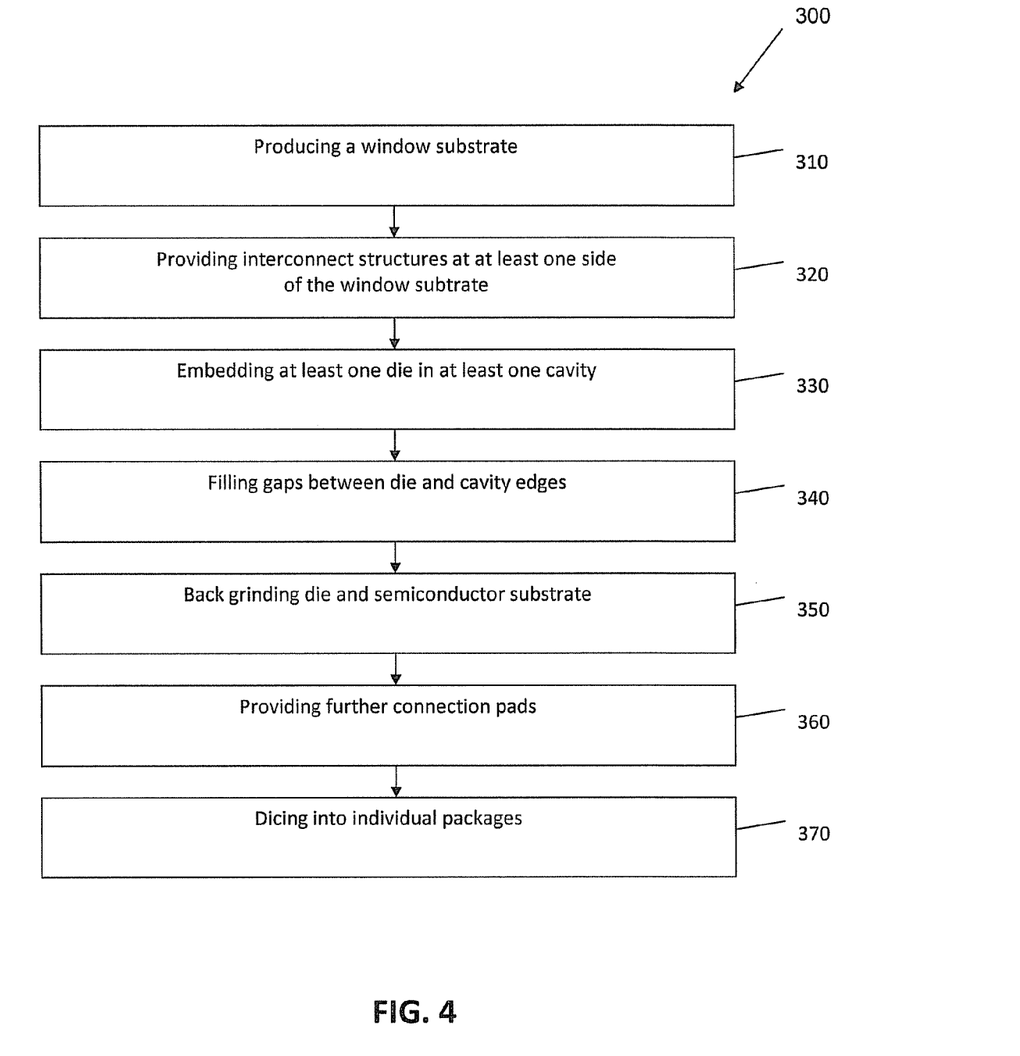
FIG. 4 illustrates a flow chart of a method for manufacturing a semiconductor device according to embodiments of the present invention.

In a second aspect, the present invention relates to a method for manufacturing a semiconductor device. The method may be especially suitable for creating a semiconductor device as described above, although embodiments of the present invention are not limited thereto. The method comprises obtaining an inorganic substrate provided with interconnect structures, providing at least one cavity in the inorganic substrate thus forming the window substrate and embedding at least one semiconductor die in the cavity, the at least one die being connected to the interconnect structures. It is an advantage of methods according to embodiments of the present invention that they result in semiconductor devices wherein the interposer substrate or the components fulfilling this function are mainly consisting of materials with the same coefficient of thermal expansion or with a closely matched coefficient of thermal expansion, over a broad temperature range, compared to the coefficient of thermal expansion of the die. Consequently an improved mechanical stability and thermal performance is obtained. In other words, the method advantageously results in semiconductor devices that suffer less from thermal stress and that allow limiting the wafer-level warpage once the die is assembled to the interconnect structures. It results in devices of which the thermal performance is good e.g. significantly improved. By way of illustration, embodiments of the present invention not being limited thereto, further features and advantages will be illustrated with reference to FIG. 5 to FIG. 8, indicating standard and optional steps of exemplary methods for making a semiconductor device according to embodiments of the present invention. A flow chart of standard and optional steps of a method for manufacturing semiconductor devices according to an exemplary embodiment of the present invention is illustrated in FIG. 4.

In a first exemplary method 300, the method comprises obtaining an inorganic substrate 110 in a first step 310. The inorganic substrate 110 may be made of any material with a CTE matched or closely matched over a broad temperature range, e.g. in a range 0° C. to 200° C., advantageously in a range −55° C. to 300° C., to the coefficient of thermal expansion of the semiconductor devices to be packaged. Most advantageously, the inorganic substrate material is chosen to be substantially identical to the material wherein the major part of semiconductor die is fabricated in. A typical example of material that often may be used is silicon material in relation to the packaging of Si-based semiconductor devices. In the inorganic substrate, at least one hole, which will form the at least one cavity for embedding the die in, is made, e.g. through etching or via laser cutting, the inorganic substrate thus being a window substrate 110. The manufacturing of the at least one hole may be part of the current method, or a window substrate 110 comprising such a hole may be obtained. The cavity may have features and aspects as described in the first aspect. For example, typically cavities are provided such that, before filling, about 10% to 90% open area is present on the surface of the window substrate. Manufacturing of the hole, i.e. the window, in the window substrate may be performed in any suitable manner. One example of a manufacturing technique for providing such a window is by a pulsed etching process, also known as a Bosch process. Such an etching process refers to a process in which an etching step is alternated with a deposition step and this is repeated to achieve nearly vertical structures. The plasma used for etching contains some ions, which attack the wafer from a nearly vertical direction. For silicon, this pulsed etching preferably uses sulfur hexafluoride source gas [SF6], while for the deposition of a chemically inert passivation layer, preferably a C4F8 source gas is used and each pulsed phase preferably lasts for several seconds. The passivation layer protects the entire substrate from further chemical attack and prevents further (lateral) etching. However, during the etching phase, the directional ions that bombard the substrate attack the passivation layer at the bottom of the trench (but not along the sides). The etc/deposition steps are repeated many times, resulting in a large number of very small isotropic etch steps taking place only at the bottom of the etched pits. To etch through a 0.5 mm silicon wafer, for example, 100-1000 etch/deposit steps are needed. Typically the etching process results in sidewalls having a scalloped surface. Another example of an etching process that can be used is a KOH etch, using a 111 silicon window substrate.

In a second step 320, interconnect structures may be provided at one side of the window substrate. The interconnect structures 140 may be provided such that the interconnect structures 140 are present over the full surface of the window substrate 110, i.e. also at these positions where a cavity has been created, i.e. thus forming a side wall of the cavity. In the present exemplary method, the interconnect structures are made on a second substrate. In the present exemplary method, such a second substrate may be a through-silicon-via substrate, forming together with the interconnect structures an interposer for the die to the next device level. The interconnect structures may e.g. be two metal layers comprising bond pads on a through-silicon-via substrate. The second substrate may also be an active semiconductor device wafer with through-Si-via connections in order to achieve a 3D stacked device, in other words 3D integration is not limited to passive interposer substrates. The interconnect structures then are provided at the one side of the window substrate by connecting the one side of the window substrate with the second substrate at the side where the interconnect structures 140 are present. The latter may for example be obtained by flipping the substrates on each other, by using a polymer glue layer, etc. . . . The connection of the window substrate with the second substrate is illustrated in FIG. 5 part (a).

Figure 5:
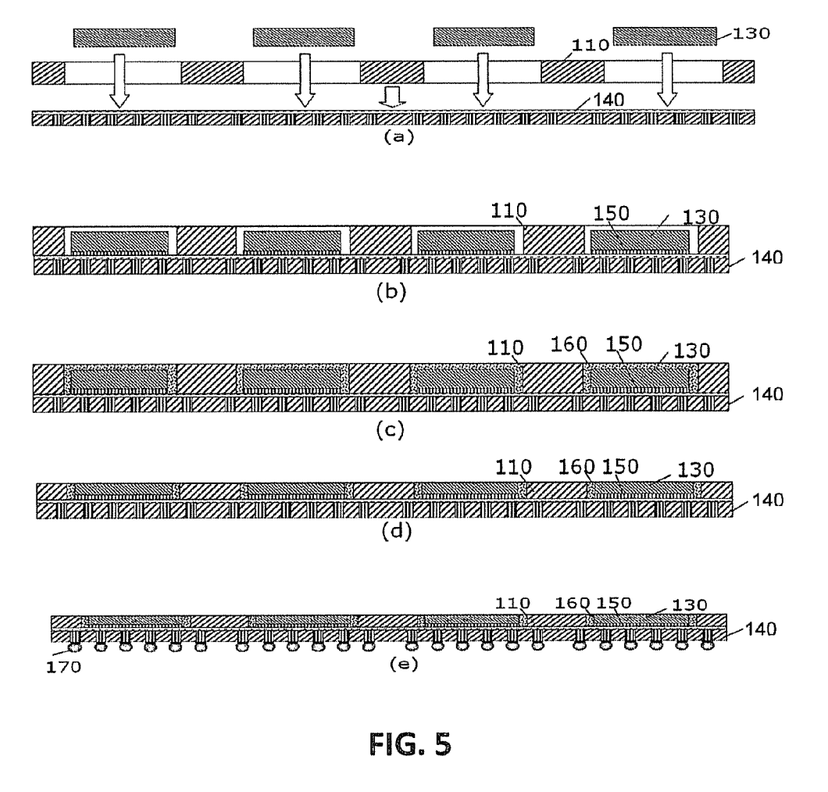
FIG. 5 illustrates a manufacturing method for providing a semiconductor device including a through silicon via substrate.

In step 330, the at least one die is embedded in the cavity as also illustrated in FIG. 5 part (a) and connected to the interconnect structures. Electrical connections are realized between the pads of die 130 and pads on the interconnect structure 140, which may be referred to as a die-to-interposer connect 150. This can be realized using conventional technologies such as, but not limited to, solder flip chip, micro-bump solder joining, conductive adhesive joining, anisotropic conductive adhesive joining, metal-metal thermocompression joining, oxide-metal joining. The at least one die 130 could comprise a stack of dies that are interconnected using any suitable mechanism such as for example Cu—Cu thermo-compression, etc. If applicable, connection of further dies to the initial die may be performed prior to or after connecting the first die to the interconnect structures. The die 130 or die stack can be bound to the interconnect structures in a flip-chip style using e.g. solder, micro-bump solder joining, conductive adhesive joining, anisotropic conductive adhesive joining, metal-metal thermocompression joining, oxide-metal joining, etc. The result is an intermediate device as shown in FIG. 5 part (b).

It is to be noted that the order of assembly of the window substrate 110, to the interconnect structures 140 can be done both before or after mounting the die, 130. By way of example, step 320 may be performed before step 330 or alternatively step 330 may be performed prior to step 320. It is also to be noted that one advantageous order may be—although embodiments of the invention are not limited thereto—to start with the thinner parts first, e.g. if a thin substrate is used, then first the window substrate may be assembled to the interconnect and thereafter the die may be embedded, or alternatively if a thin die is used, then the die may be embedded first and the assembly with the interconnect structures may be obtained thereafter.

In step 340, the gaps between the die and edge of the cavity in the window substrate may be filled using a filling material 160. The filling material 160 may for example be an epoxy resin, silica based material, materials similar as those used in under fill, glob-top or overmould compounds, etc although embodiments of the present invention are not limited thereto.

By way of example, the filling material may be selected to have a thermal expansion coefficient that is as close as possible to the thermal expansion coefficient of the die material, although embodiments of the present invention are not limited thereto. The latter is illustrated in FIG. 5 part (c). The filling may be part of the underfill part after die bonding, e.g. in case of flip chip.

In step 350, the window substrate 110 and the at least one die 130 can be back grinded in a single operation, leaving the back surface of the die and the surface of the window substrate 110 exposed in a single plane. The latter is advantageous as it allows contacting the window substrate 110 and the die 130 simultaneously with a heat sink, e.g. with a flat surface of the heat sink. The result of the grinding step is illustrated in FIG. 5 part (d). Back grinding may for example be performed using mechanical back grinding, whereby the thickness of the entire structure (the interconnect structures 140, the window substrate 110 and embedded die 130) can be grinded down to a thickness typical for IC packaging of about 300 µm.

In step 360, further connections may be made to the front side of the interconnect substrate 120 by providing pads 170 e.g. solder balls. The latter provides connections to e.g. the next assembly level, for example the printed circuit board (PCB). The provided solder balls are illustrated in FIG. 5 part (e).

Embodiments of the present invention are especially suitable for manufacturing a plurality of semiconductor devices at the same time. By providing a plurality of cavities, filling each of them with one or more dies and by finalizing the semiconductor device manufacturing method as described above by cutting the obtained assembly into individual packages, a plurality of semiconductor devices can be manufactured during the same manufacturing process. In optional step 370 (not shown in FIG. 5), the semiconductor device can be diced into individual packages.

Figure 6:
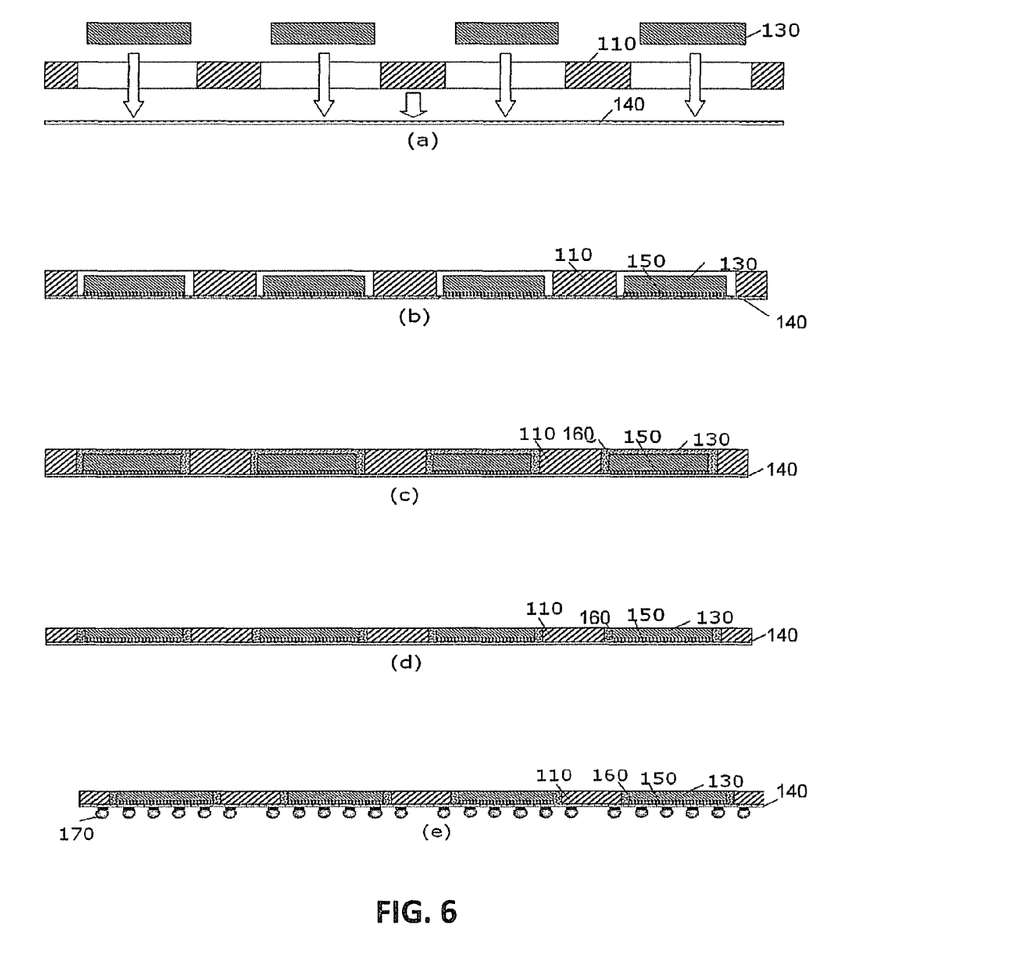
FIG. 6 and FIG. 7 illustrates a manufacturing method for providing a semiconductor device including a flexible substrate.

In a second exemplary method 300, a similar manufacturing process is described as in the first exemplary method, but the interconnect structures are introduced using a thin, flexible interconnect interposer structure rather than a rigid interconnect substrate. Such a thin, flexible interposer can e.g. be a thin Cu-polyimide flex circuit, or similar flexible structures based on other polymers such as but not limited to e.g. Liquid crystal polymers. This flexible substrate should have interconnect pads on both sides of the foil, interconnecting both sides using standard via connections through the thin polymer layer of the flex foil. Providing the interconnect structures 140 to the window substrate 110, step 320, and embedding at least one die 130 in at least one cavity of the window substrate 110, step 330, are performed in the same way as described above for the rigid interconnect substrate case (FIG. 5) The provision of an UTF interconnect structure is shown in FIG. 6 part (a) while providing connection pads directly to the interconnect structures 140 is illustrated in FIG. 6 part (e). The thin flexible circuit being thin and flexible, results in a low warpage of the final assembly (window substrate with embedded die and attached thin interconnect structures, e.g. the interconnect flex circuit), as the mechanical properties of the final structure is dominated by the embedded die and window-substrate with matched CTE.

It is important to note that the order of assembly of the window substrate, 110, to the interconnect structures 140, e.g. the flexible interconnect substrate, can be done both before or after mounting the die, 130, in the window substrate 110. (Step 320 before step 330 or step 330 before step 320).

In a third exemplary method 300, a similar manufacturing process is described as in the second exemplary method, but providing interconnection is performed using a second, carrier substrate comprising the thin interconnect structures. These may be thin film polymer and metal interconnect layers or traditional back-end-of-line interconnect layers realized in a prior step on this second carrier substrate.

Figure 7:
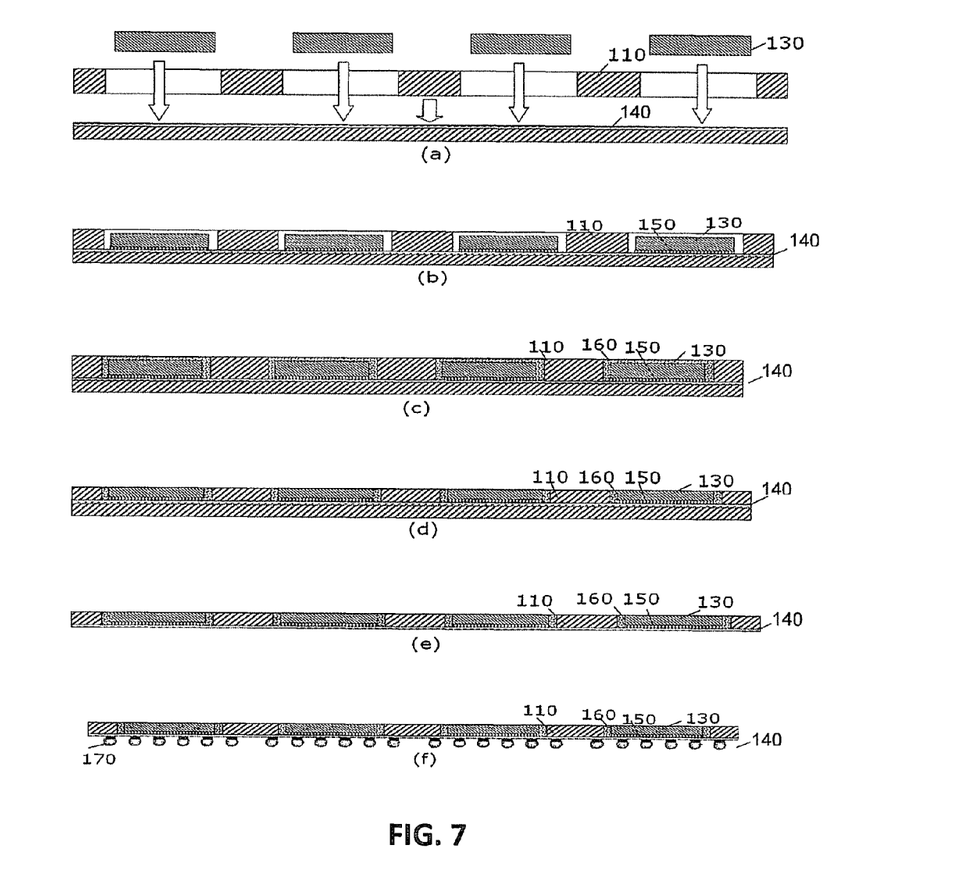

In step 320, the window substrate then is contacted with the thin flexible interconnect structures on the second carrier substrate. After embedding of the die 130 and filling the gaps, an additional process step is added where second carrier substrate is removed, separating at the interface between this second carrier substrate and the thin interconnect structures. The latter is illustrated in FIG. 7, illustrating the connections step of the window substrate with the interconnect structures on the second, carrier substrate in part (a) and illustrating the effect of removing the carrier substrate in a subsequent step by the transition in FIG. 7 from part (d) to part (e). The carrier substrate may for example be removed by mechanical back grinding followed by a dry or wet etch for removing the remaining carrier substrate material, although embodiments of the present invention are not limited thereto. An example of an alternative method is the use of intermediate material layer between the thin interconnect structure and the secondary carrier substrate. After embedding the die and bonding to the window wafer, the secondary wafer can be removed from this stack by e.g. mechanical sliding (case thermo-plastic glue layers), decomposition (low decomposition temperature glues), peel-off (glue with low peel force strength) or laser ablation (case laser radiation polymer composition, limited to the use of CTE-matched glass carrier)

The provision of the solder balls on pads of the interconnect structure is shown in part (f) of FIG. 7.

It is important to note that also here, the order of assembly of the window substrate, 110, to the interconnect structures can be done both before or after mounting the die, 130, in the window substrate 110. (Step 320 before step 330 or step 330 before step 320).

In a fourth exemplary method 300, a similar method for manufacturing semiconductor devices is shown as in the first, second and third exemplary method, but the provision of a window substrate with cavities and interconnect structures in the present example is obtained by first providing the interconnect structures 140 to the window substrate 110 instead of providing it to a secondary substrate. The cavities are realized in the window substrate 110 with the interconnect structures 140 present on one side, e.g. by wet or dry etching from the side opposite to the interconnect structures. In this way the window substrate forms, together with the interconnect structures, the interposer substrate. The etching process that may be used for generating the cavity may be e.g. the Bosch etching process or alternative processes, as described above. In order not to etch the interconnect structure, a stop layer may be provided on the interconnect structure, such as for example an oxide or SiC layer. In some embodiments, the method may comprise an additional step of removing the stop layer prior to contacting the die with the interconnect structure. The interconnect structures form a kind of a membrane across the window substrate cavities.

Figure 8:
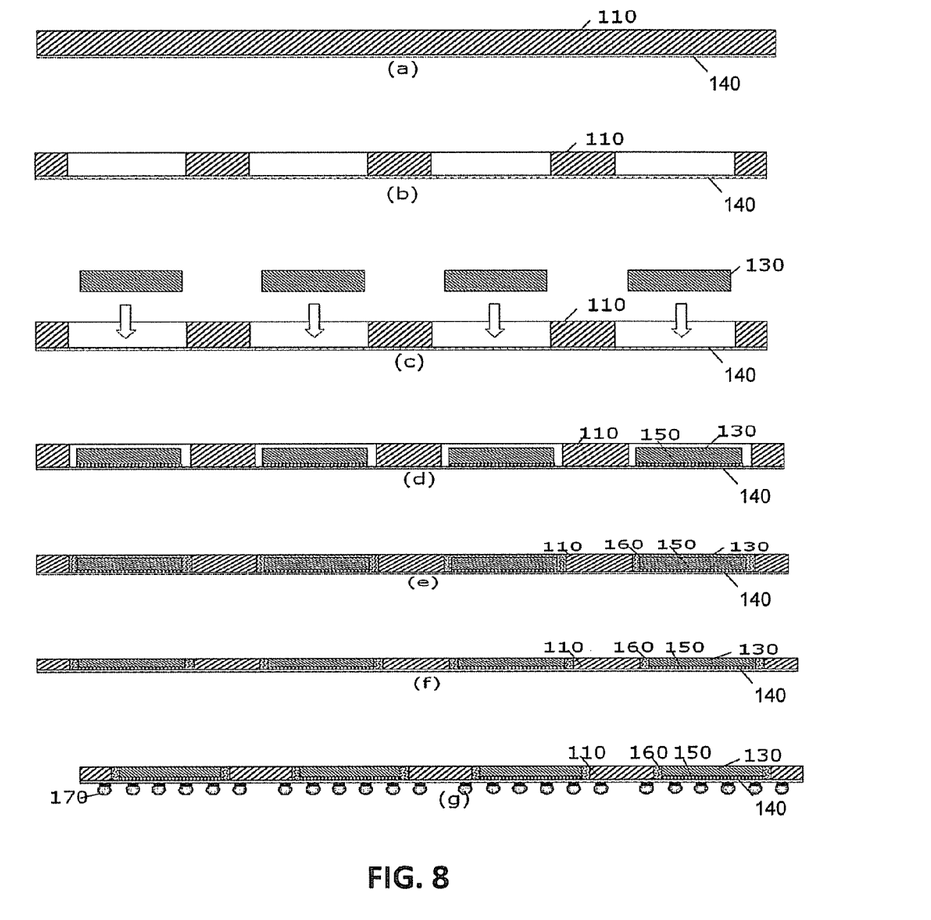
FIG. 8 illustrates a manufacturing method for providing a semiconductor device using a device wafer, with interconnect metallization on the wafer front side, for realizing the CTE-matched substrate with window-shaped holes formed from the back of this substrate.

The latter is illustrated in FIG. 8 parts (a) and (b), followed by provision of the at least one die in the cavity for connecting the at least one die 130 with the interconnect structures 140 as shown in part (c) resulting in the structure as shown in part (d). Further steps of filling the gaps, back grinding and provision of pads to connect a further assembly level to the interconnect structures are shown in parts (e), (f) and (g) respectively.

Whereas the above exemplary methods illustrate the possibility of providing an interposer substrate at one side of the die, in a similar manner, connectivity at the other side of the die also can be obtained.

In some embodiments according to the present invention, the method comprises providing a heat sink. The latter may be performed by providing a heat conductive layer such as thermal grease.

Furthermore, whereas a number of process steps have been indicated, further optional steps as known by the person skilled in the art of manufacturing of semiconductor devices also may be included. One example thereof may be the use of a planarization step provided for the interposer substrates, embodiments of the present invention not being limited thereto.

It is an advantage according to embodiments of the present invention that the proposed manufacturing flow is such that the active die is mounted onto the package after fabrication of the window substrate and the interconnect structures. The dies and the interconnect structures can thus be made independently before embedding the dies in the combined filling material and window substrate material surrounding. This avoids damage of the dies in further processing. As the assembly of the first semiconductor device and the interposer are mainly manufactured before die assembly, testing is possible before die mounting. The latter reduces the loss of material in case an error is identified.

By way of illustration, embodiments of the present invention not being limited thereto, a number of further particular examples are discussed below, illustrating features and advantages of embodiments according to the present invention.

Figure 9:
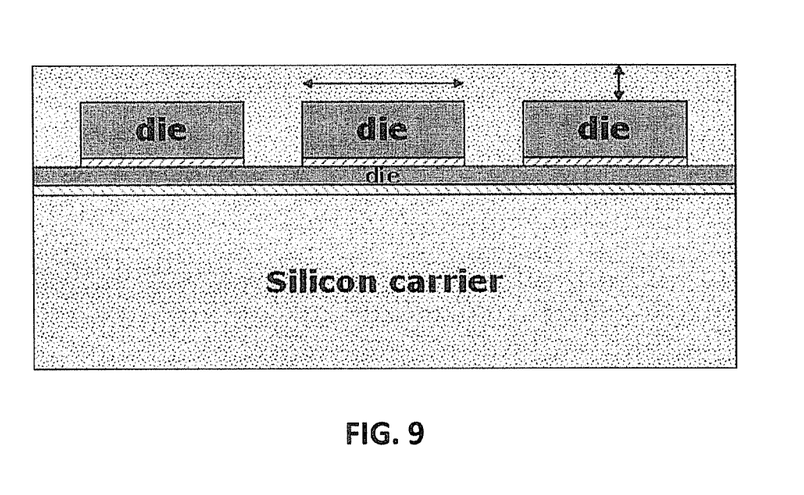
FIG. 9 and FIG. 10 illustrate an integrated circuit package design according to prior art (FIG. 9) and according to an embodiment of the present invention (FIG. 10), as used for simulating effects of the difference in thermal expansion coefficients illustrating features and advantages of embodiments of the present invention.
Figure 10:
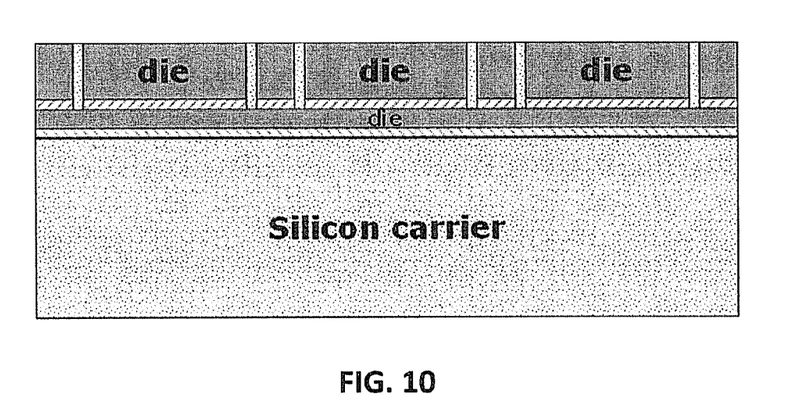

For the further examples, a comparison is made between two integrated circuit packages wherein a die is interconnected using a silicon interposer substrate. On the one hand an integrated circuit package wherein the die is packaged through a transfer moulding compound encapsulation as known from prior art and as illustrated in FIG. 9 is considered, whereas on the other hand, an integrated circuit package wherein the die is positioned in windows in a silicon substrate according to an embodiment of the present invention as illustrated in FIG. 10 is considered. For the calculations made in the examples, following dimensions were used, embodiments of the present invention not being limited thereby. The distances between different dies was selected to be 10 mm, the dies being 6×6 mm$^2$ in surface size. The dies or die stack were 300 μm thick, connected via 10 μm glue and interconnects to a 50 μm bottom wafer that itself was bonded to a silicon carrier via a 10 μm glue layer (HT1010 by Brewer Science EVG). For the prior art packaging, a 200 μm mold on top of the die was taken into account, the molding properties having a thermal expansion coefficient of 10 ppm/° C. and having an elastic modulus of 28 GPa. Simulations were performed using Finite Element Models.

Figure 11:
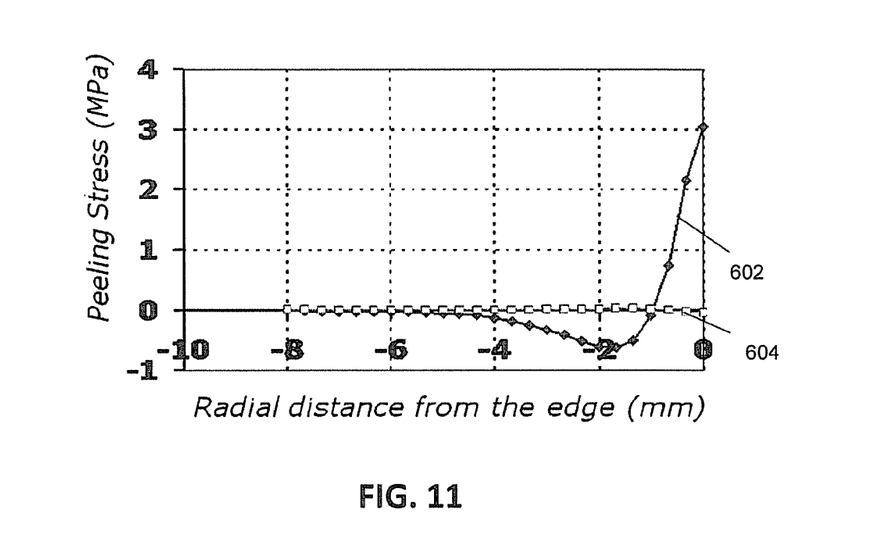
FIG. 11 illustrates the peeling stress as function of the radial distance from the edge of a glue layer connecting a bottom wafer and a silicon carrier for integrated circuit package designs according to FIG. 9 and FIG. 10 respectively.

In a first particular example, the peeling stress at the edges of the glue layer between the bottom wafer and the silicon carrier as used during manufacturing of integrated circuit packages was evaluated for both the prior art device of FIG. 9 and the integrated circuit packaging according to an embodiment of the present invention according to FIG. 10. FIG. 11 illustrates the peeling stress, expressed in MPa, as function of the radial distance to the edge of the glue layer, expressed in mm. It can be seen that the peeling stress is high at the edge of the glue layer and decreases with the radial distance from the edge for the prior art packaging device of FIG. 9 (as shown by curve 602 in FIG. 11), whereas, in comparison with the prior art packaging, the peeling stress is substantially zero in the packaging according to an embodiment of the present invention (as shown by curve 604 in FIG. 9). The latter is illustrative for the forces induced when using materials having different thermal expansion coefficients and illustrates advantages of embodiments according to the present invention.

Figure 12:
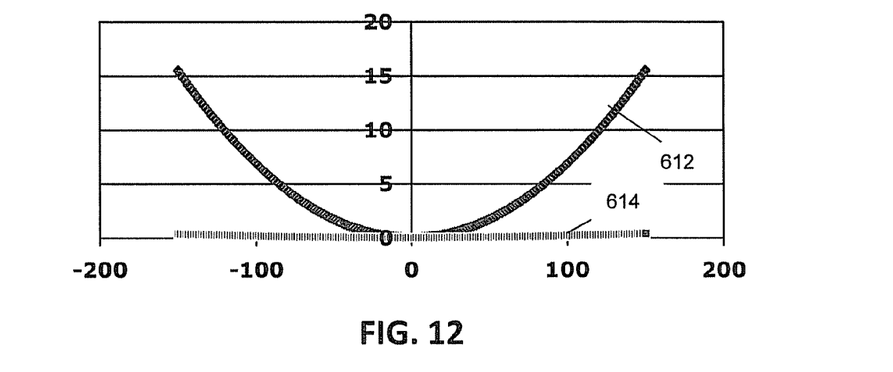
FIG. 12 illustrates the curvature of a bottom wafer after release from the silicon carrier for integrated circuit package designs according to FIG. 9 and FIG. 10 respectively.

In a second particular example, the curvature of the bottom wafer was evaluated after removal of the silicon carrier for both the prior art device of FIG. 9 and the integrated circuit packaging according to an embodiment of the present invention according to FIG. 10. FIG. 12 illustrates the curvature indicating the radial distance in mm on the x-axis and the out-of plane bowing of the wafer in mm on the y-axis.

It can be seen that in contrast to the prior art integrated circuit packaging where strong curvature of the packaging occurs (as shown by curve 612 in FIG. 12), in the packaging according to an embodiment of the present invention no such curvature can be seen (as shown by curve 614 in FIG. 12). The latter illustrates features and advantages of embodiments according to the present invention.

In one aspect, the present invention also relates to an interposer device, the interposer device comprising a window substrate being an inorganic substrate comprising at least one cavity for mounting at least one semiconductor die. Furthermore also a substantially planar interconnect structure is present, fixed to one side of the window substrate so as to be adjacent the cavity in the window substrate. The interconnect structure is arranged for receiving the at least one semiconductor die for forming the electrical connection between the die and another level of assembly or packaging of the semiconductor device. The interconnect structure may e.g. be a flexible layer fixed to the window substrate. The interposer device may be provided as intermediate product, and can be further processed, e.g. by an assembler. The interposer device may be made using a method as described in any of the above processes. In some embodiments, where the interposer device is made by first providing the interconnect structure on the substrate and then etching the substrate to form the window substrate, a stop layer may be present on the interconnect structure. In some embodiments a passivation or protection layer may be provided. In some embodiments electrical connectors may be provided on the interposer substrate, such as for example Cu contacts, e.g. electroplated electrical contacts, ball grid contacts, solder bumps, etc. Other features, described in any of the above aspects, also may be present. By way of example, embodiments of the present invention not being limited thereto, an illustration of a possible interposer device is shown in FIG. 8 part (b).

While the invention has been illustrated and described in detail in the drawings and foregoing description, such illustration and description are to be considered illustrative or exemplary and not restrictive. The invention is not limited to the disclosed embodiments.

Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measures cannot be used to advantage. Any reference signs in the claims should not be construed as limiting the scope.

The foregoing description details certain embodiments of the invention. It will be appreciated, however, that no matter how detailed the foregoing appears in text, the invention may be practiced in many ways, and is therefore not limited to the embodiments disclosed. It should be noted that the use of particular terminology when describing certain features or aspects of the invention should not be taken to imply that the terminology is being re-defined herein to be restricted to include any specific characteristics of the features or aspects of the invention with which that terminology is associated.

The invention claimed is:

1. A semiconductor device comprising:
   at least one semiconductor die;
   a window substrate being an inorganic substrate comprising at least one cavity for mounting the at least one semiconductor die, wherein there are no electrical feedthroughs in the window substrate; and
   a substantially planar interconnect structure provided at at least one side of the window substrate, wherein the interconnect structure is pre-formed on a further substrate,
   the at least one semiconductor die being positioned inside the at least one cavity, and being connected to the interconnect structure adjacent the at least one semiconductor die, the interconnect structure forming an electrical connection between the at least one semiconductor die and another level of assembly or packaging of the semiconductor device.

2. The semiconductor device of claim 1, wherein a material of the window substrate has a coefficient of thermal expansion being the same or being closely matched to a coefficient of thermal expansion of the semiconductor die.

3. The semiconductor device of claim 1, wherein the at least one cavity extends throughout the window substrate.

4. The semiconductor device of claim 1, further comprising filling materials at positions between the at least one semiconductor die and the edges of the at least one cavity in the window substrate material.

5. The semiconductor device of claim 1, wherein the interconnect structure is adapted for providing connectivity between the at least one semiconductor die using a first input/output pitch typical for the at least one semiconductor die and a further element using a larger input/output pitch.

6. The semiconductor device of claim 1, wherein the interconnect structure is physically located between the at least one semiconductor die and electrical contacts of the further level of assembly or packaging of the semiconductor device.

7. The semiconductor device of claim 1, further comprising at least one die-to-interposer connection electrically connecting the at least one semiconductor die to the interconnect structure, wherein the die-to-interposer connection includes at least one of (i) a flip-chip connection, (ii) a thermocompression connection, (iii) a conductive adhesive connection, (iv) an anisotropic conductive adhesive connection, (v) an oxide-metal connection, and (vi) a micro-bump solder connection.

8. The semiconductor device of claim 1, the further substrate comprising (i) a through-silicon-via substrate forming an interposer with the interconnect structure or (ii) a thin flexible substrate with interconnect layers and through-substrate vertical connections forming an interposer with the interconnect structure.

9. The semiconductor device of claim 8, wherein the through-silicon-via substrate comprises an active device wafer.

10. The semiconductor device of claim 1, wherein the interconnect structure and the window substrate form at least part of an interposer.

11. The semiconductor device of claim 1, further comprising a heat sink in direct contact with the at least one semiconductor die and the window substrate.

12. The semiconductor device of claim 1, the at least one semiconductor die being a stack of dies positioned in the at least one cavity of the window substrate, the stack of dies having at least one die comprising through-silicon-vias for electrically connecting further dies with the another level of assembly or packaging of the semiconductor device.

13. An interposer device comprising:
    a window substrate being an inorganic substrate comprising at least one cavity for mounting at least one semiconductor die, wherein there are no electrical feedthroughs in the window substrate; and
    a substantially planar interconnect structure, pre-formed on a further substrate and fixed to one side of the window substrate so as to be adjacent to the at least one cavity and arranged for forming an electrical connection between the at least one semiconductor die and another level of assembly or packaging.

14. The interposer device of claim 13, wherein the interconnect structure comprises any or a combination of a passivation layer, ball grid, and solder bumps for connecting with the at least one semiconductor die.

15. The interposer device of claim 13, further comprising a die-to-interposer connection configured to electrically connect the at least one semiconductor die to the interconnect structure, the die-to-interposer connection comprising at least one of (i) a flip-chip connection, (ii) a thermocompression connection, (iii) a conductive adhesive connection, (iv) an anisotropic conductive adhesive connection, (v) an oxide-metal connection, and (vi) a micro-bump solder connection.

16. A method for manufacturing a semiconductor device, the method comprising:
    obtaining a window substrate comprising at least one cavity, wherein there are no electrical feedthroughs in the window substrate;
    providing a substantially planar interconnect structure to at least one side of the window substrate, wherein the interconnect structure is pre-formed on a further substrate; and
    embedding at least one semiconductor die in the at least one cavity, the at least one semiconductor die being electrically connected to the interconnect structure adjacent to the at least one semiconductor die, the interconnect structure forming an electrical connection between the at least one semiconductor die and another level of assembly or packaging of the semiconductor device.

17. The method of claim 16, further comprising interposing the at least one semiconductor die connected at a first input/output connection pitch with a further element connectable at a larger input/output connection pitch using the interconnect structure.

18. The method of claim 16, wherein providing the substantially planar interconnect structure comprises bonding the window substrate with the further substrate, wherein the further substrate is a through-silicon-via substrate comprising the interconnect structure.

19. The method of claim 16, further comprising back grinding the at least one semiconductor die and the window substrate.

20. The method of claim 16, further comprising forming at least one die-to-interposer connection electrically connecting the at least one semiconductor die to the interconnect structure, wherein the die-to-interposer connection comprises at least one of (i) a flip-chip connection, (ii) a thermocompression connection, (iii) a conductive adhesive connection, (iv) an anisotropic conductive adhesive connection, (v) an oxide-metal connection, and (vi) a micro-bump solder connection.

* * * * *